United States Patent [19]
Chen et al.

[11] Patent Number: 5,319,660
[45] Date of Patent: Jun. 7, 1994

[54] MULTI-QUANTUM BARRIER LASER

[75] Inventors: Ying C. Chen, Scarsdale; Harvey B. Serreze, Pound Ridge, both of N.Y.

[73] Assignee: McDonnell Douglas Corporation, St. Louis, Mo.

[21] Appl. No.: 890,167

[22] Filed: May 29, 1992

[51] Int. Cl.$^5$ .............................................. H01S 3/19
[52] U.S. Cl. ........................................ 372/45; 257/14
[58] Field of Search ................ 372/45, 43; 257/14, 257/15, 17, 18

[56] References Cited

U.S. PATENT DOCUMENTS

| | | | |
|---|---|---|---|
| 4,804,639 | 2/1989 | Yablonovitch | 372/45 |
| 5,040,186 | 8/1991 | Logan et al. | 372/45 |
| 5,091,756 | 2/1992 | Iga et al. | 257/14 |
| 5,170,407 | 12/1992 | Schubert et al. | 372/45 |
| 5,181,086 | 1/1993 | Yoshida | 372/45 |

OTHER PUBLICATIONS

Iga, et al, Electronic Reflectance of Multi-Quantum Barrier Electronic Letters, vol. 22, No. 9 pp. 1008-1010, Sep. 11, 1986.
Takagi, et al, Potential Barrier Height Analysis of AlGaInP Multi-Quantum Barrier, Applied Physics, vol. 29, No. 11 pp. L1977-L1980, Nov. 1990.
Kishino, et al, Enhanced Carrier Confinement Effect by Multi-Quantum Barrier in 660 nm GaInP.AlInP Visible Lasers, Applied Physics Letters, vol. 58, No. 17, pp. 1822-1824, Apr. 1991.

Primary Examiner—Georgia Y. Epps
Attorney, Agent, or Firm—Guy R. Gosnell; Benjamin Hudson, Jr.; Timothy H. Courson

[57] ABSTRACT

A semiconductor laser device which provides enhanced carrier confinement. This device utilizes a single or multi-quantum well structure located between graded index confinement layers which are in turn between a pair of cladding layers. Semiconductor layers are selected such that the quantum well active region and confinement layers form a PN junction by being located between layers having N-type dopants on one side and P-type dopants on the second side for proper diode response. Within each confinement layer there is formed a plurality of multi-quantum barrier layers which serve to further increase the carrier confinement within the quantum well region by increasing the effective potential barrier within the graded index confinement region. The multi-quantum barrier layers are comprised of layers of the material forming the graded index confinement layers having alternating large and small concentrations of the material whose percentage is being varied in the graded index confinement layers.

14 Claims, 1 Drawing Sheet

MULTI-QUANTUM BARRIER LASER

BACKGROUND OF THE INVENTION

The present invention relates generally to a semiconductor laser and more particularly to a semiconductor laser incorporating multi-quantum barriers for improved carrier confinement properties.

In many modern applications it is desirable to utilize efficient semiconductor laser devices. The efficiency of semiconductor laser devices may be increased by improving the optical and the carrier confinement of the semiconductor laser device. Such efficient semiconductor laser devices may be utilized in a variety of applications including semiconductor diode laser pumping of Nd:YAG lasers and optical communication, detection and illumination applications.

For efficient semiconductor laser operation it is desirable to have both optical and carrier confinement. Carrier confinement, the confinement of the holes and the electrons within the active region of the semiconductor laser device, is desirable as poor carrier confinement may cause the threshold current of the semiconductor laser device to increase and the characteristic temperature $T_0$ to decrease. Carrier confinement in a semiconductor laser device having an active region, typically a quantum well region, is generally acheived by surrounding the active region of the semiconductor laser with materials having a large bandgap such that the carriers will be much more likely to populate the active region than they would the adjacent materials having the larger bandgap. While this method of utilizing materials having a large bandgap adjacent to the active region is successful in confining carriers, some material systems do not have readily available materials with sufficiently large bandgaps that can be grown adjacent to the active region to provide carrier confinement.

For example, an $(Al_xGa_{1-x})_{0.5}In_{0.5}P$ semiconductor laser may be grown such that the quantum well $Ga_{0.5}In_{0.5}P$ is positioned between a pair of graded index layers of $(Al_xGa_{1-x})_{0.5}In_{0.5}P$ in which the aluminum mole fraction is linearly increased in a direction away from the quantum well. The bandgap is relatively small in the graded index region as the $(Al_xGa_{1-x})_{0.5}In_{0.5}P$ semiconductor laser has a conduction band with at least two valleys. For aluminum mole fractions, x, less than 0.65, the potential barrier achievable is determined by the gamma valley. Within this transition region wherein the aluminum mole fraction is less than 0.65, the bandgap energy of the GRINSCH structure gradually increases as the aluminum mole fraction increases as is desired for carrier confinement improvement. At aluminum mole fractions greater than 0.65, the potential barrier achievable, a satellite valley, the X valley. In the X valley, however, the bandgap energy changes very little with increasing aluminum mole fractions such that the bandgap energy in this portion of the GRINSCH region does not increase substantially and thus does not significantly improve and assist the carrier confinement process. A similar situation in AlGaAs lasers occurs for aluminum mole fraction greater than 0.37.

Iga, et al in an article entitled *Electron Reflectance of Multiquantum Barrier* (MQB) published in Electronics Letters on Sep. 11, 1986, Volume 22, No. 19, pages 1008-1010 as well as Takagi, et al in an article entitled *Potential Barrier Height Analysis of AlGaInP Multi-Quantum Barrier* (MQB) published in Japanese Journal of Applied Physics, Volume 29, No. 11, in November 1990, pages L1977-L1980 and Iga, et al in U.S. Pat. No. 5,091,756 reported that alternating, thin layers of high and low bandgap materials can form an effective potential barrier that is larger than the potential of either of the barrier materials alone. The increased effective barrier height of the multi-quantum barrier is due to the interference of the electron waves which are reflected by the various barrier layers in a manner analogous to the interference of optical waves being reflected from a multi-layer dielectric coating. Additionally, Kishino, et al in an article entitled, *Enhanced Carrier Confinement Effect by the Multiquantum Barrier in 660 nm GaInP-/AlInP Visible Lasers*, published in Applied Physics Letters, Volume 58, No. 17 on Apr. 29, 1991 on pages 1822-1824 utilized the multi-quantum barrier effect of improving carrier confinement to increase the characteristic temperature of the visible laser they were experimenting with so as to decrease the threshold current.

It should be noted, however, that each of these implementations of a multi-quantum barrier was accomplished in a semiconductor laser diode which did not include a graded index region adjacent to the active region but instead utilized confinement layers having a consistent composition therethrough. Additionally, in each of the prior multi-quantum barrier implementations the layers were lattice matched and were not strained layers.

It would be desirable to develop a semiconductor laser device in which the carrier confinement is improved such that the threshold current is decreased and the characteristic temperature is increased. Additionally, it is desirable to improve carrier confinement in graded index separate confinement heterostructure semiconductor laser devices as well as in semiconductor laser devices having strained layers within its GRINSCH laser structure.

SUMMARY

There is provided by this invention a semiconductor laser device which provides enhanced carrier confinement. This device utilizes a single or multi-quantum well structure located between graded index confinement layers which are in turn between a pair of cladding layers. The confinement layers, cladding layers, and quantum well region are deposited upon a buffer layer which has been deposited in turn on a substrate. The major surface of the semiconductor structure opposite that of the substrate has a cap layer deposited thereon. Subsequently, metalization layers are deposited on opposite surfaces of the semiconductor laser device such that an electrical contact can be maintained with the structure. Semiconductor layers are selected such that the quantum well active region and confinement layers form a PN junction by being located between layers having N-type dopants on one side and P-type dopants on the second side for proper diode response.

Within each graded index confinement layer, or alternatively within each cladding layer, there is formed a plurality of multi-quantum barrier layers which serve to further increase the carrier confinement within the quantum well region by increasing the effective potential barrier within the graded index confinement region. The multi-quantum barrier layers are comprised of layers of the material forming the graded index confinement layers having alternating large and small concentrations of the material whose percentage is being varied in the graded index confinement layers. The multi-quantum barrier layers are typically thin, with a thickness selected to approximate $\lambda/4$ wherein $\lambda$ is a wavelength of the electrons within the quantum well region. Additionally, the multi-quantum barrier layers may be strained such that alternating multi-quantum barrier layers are in compressive and tensile strain situations. The multi-quantum barrier layers may be located in any portion of the confinement layers or the cladding layers, however, they are preferably positioned near the center of the graded index confinement region. A multi-quantum barrier region is positioned in each of the confinement layers surrounding the quantum well active region.

DETAILED DESCRIPTION OF THE PREFERRED EMBODIMENT

Figure 1:
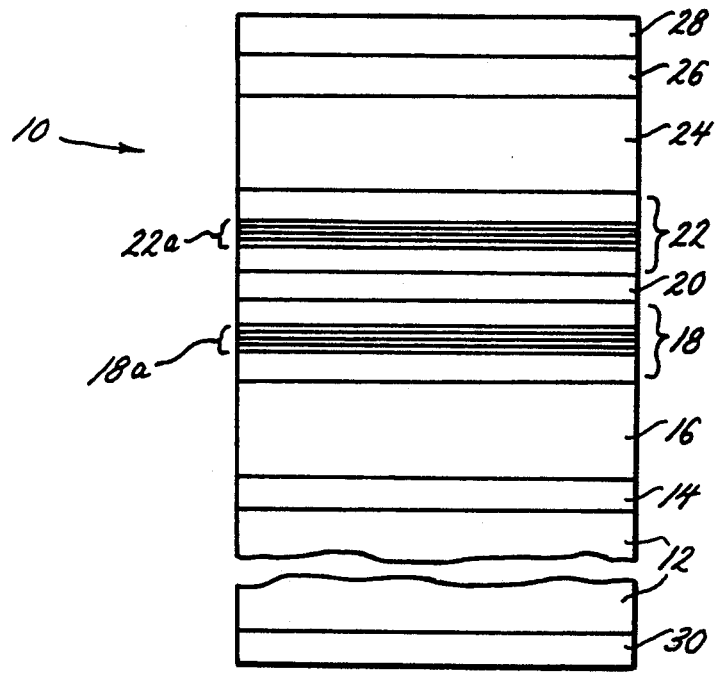
FIG. 1 is a cross-sectional view of a semiconductor laser device incorporating the principles of this invention.

Referring to FIG. 1, there is shown a cross-sectional view of a semiconductor laser device 10 incorporating the principles of this invention. Upon an N-substrate layer 12, typically comprised of GaAs, there is deposited an N-buffer layer 14, an N-cladding layer 16, a first confinement layer 18, a quantum well active region 20, a second confinement layer 22, a P-cladding layer 24, a P-cap layer 26 and a P metalization layer 28. On the opposing major surface of the N-substrate 12 from that on which the N-buffer layer 14 is deposited, an N-metalization layer 30 is deposited.

While the system of materials from which the semiconductor laser device is constructed, may be any of those well known to those skilled in the art, such as GaAs or AlGaAs material systems, an $(Al_xGa_{1-x})_{0.5}In_{0.5}P$ laser will be discussed for purposes of illustration. The N-buffer layer 14 is typically comprised of the same material of the N-substrate layer 12, such as GaAs, to provide a uniform surface upon which to deposit the remaining layers of the semiconductor structure. The N-cladding layer 16 deposited upon the N-buffer layer 14 is comprised of an alloy of AlGaInP with the particular alloy selected such that the lattice constant of the N-cladding layer 16 is matched to that of the N-substrate 14 as is well known to those skilled in the art. For maximum carrier confinement, the N-cladding layer 16 should have as large a bandgap as possible.

Figure 2:
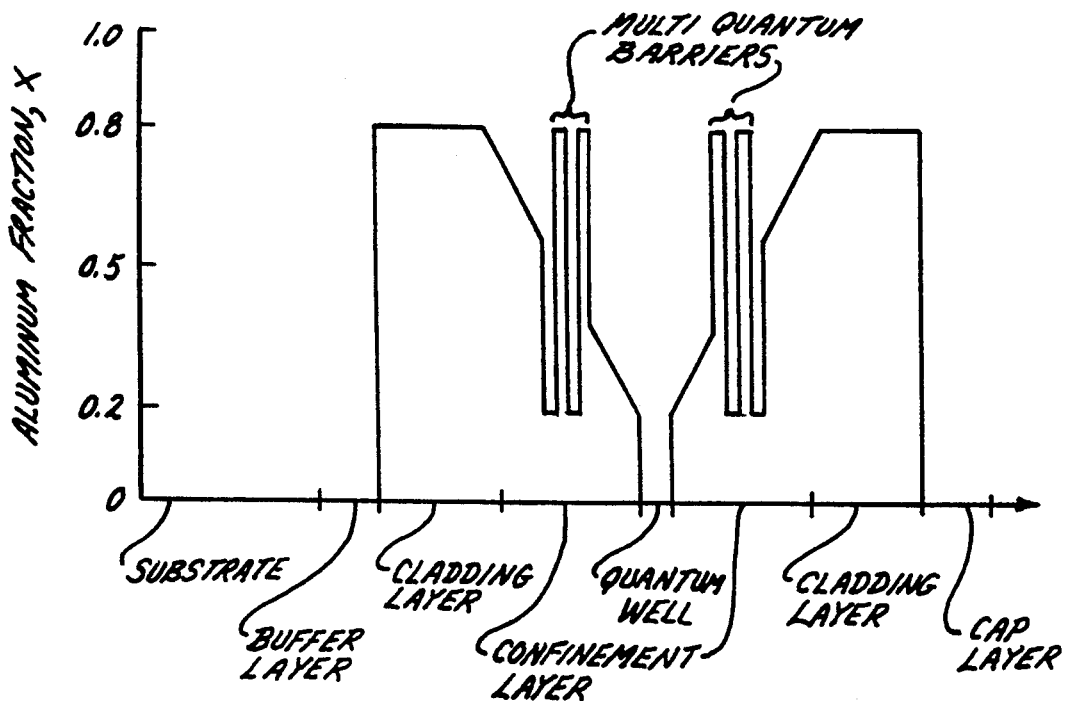
FIG. 2 is a diagram illustrating the aluminum concentration in the individual layers of the semiconductor laser device.

Upon the N-cladding layer 16, a first confinement layer 18 is formed from $(Al_xGa_{1-x})_{0.5}In_{0.5}P$. The confinement layer 18 is a graded index structure in which the fractional amount of aluminum is decreased in a direction from the cladding layer 16 toward the quantum well region 20. An example of a suitable graded index confinement layer structure is the use of $(Al_xGa_{1-x})_{0.5}In_{0.5}P$ wherein x ranges from 0.8 to 0.2 in the direction from the N-cladding layer 16 toward the quantum well active region 20. Such a graded index structure is illustrated in FIG. 2 in which the aluminum concentrations of the various semiconductor layers are plotted against the position of the layers from the N-substrate 12.

Upon the first confinement layer 18 is deposited a quantum well active region 20 which is typically a single quantum well structure. Although a multi-quantum well structure, as is well known to those skilled in the art, could be utilized as an active region in which a plurality of individual quantum well structures separated by barrier layers are deposited, a quantum well region 20 is typically comprised of $(Al_xGa_{1-x})_yIn_{1-y}P$ in which the values of x and y can be selected from the range of 0 to 1. For a multi-quantum well structure, each individual quantum well within the quantum well active region should be constructed of identical semiconductor materials such that plurality of quantum wells will produce the desired wavelength of output light.

A second confinement layer 22 is deposited upon the quantum well active region 20. The second confinement layer 22 is identical to the previously discussed first confinement layer 18 in that is it comprised of $(Al_xGa_{1-x})_{0.5}In_{0.5}P$. The second confinement layer 22 is also a graded index type in which the aluminum fraction is smallest at the interface of the quantum well 20 and the second confinement region 22 and increases in a direction toward the P-cladding layer 24 as shown in FIG. 2. Typically, the first and second confinement layers each have identical aluminum fractional ranges through which the percentage of aluminum contained in the layer is varied.

A P-cladding layer 24 is deposited on the second confinement layer 22. The P-cladding layer 24 is identical to the N-cladding layer 16 in all respects except for the type of dopants as hereinafter discussed. Thus, the P-cladding layer 24 should be lattice matched to the N-substrate 12 and should be comprised of an alloy of AlGaInP.

On the P-cladding layer 24 is deposited a P-cap layer 26 and a P-metalization layer 28. The P-cap layer 26 is comprised of the same material as that which forms the N-substrate 12, typically GaAs. The P-metalization layer 28 may be of any metal such that ohmic electrical contact may be maintained with the P-side of the semiconductor laser structure 10. For example, a titanium/platinum/gold metal may be utilized to form the P-metalization layer 28. The N-metalization layer 30 formed on the opposing major surface of the N-substrate 12 from that on which the N-buffer layer 14 is formed may also be of any suitable metal such that ohmic electrical contact may be maintained with the N-side of the semiconductor laser device 10. A typical N-metalization layer 30 may be comprised of a gold/germanium/nickel/gold metal structure.

As is well known to those skilled in the art, the N and P designations for the various semiconductor layers refer to the type of dopants introduced into the material forming the particular semiconductor layer. For the layers having an N-dopant such as the N-substrate 12, N-buffer 14, and N-cladding layers 16 suitable N-type dopants include silicon, selenium, and sulfur. Likewise, layers having a P-type dopant introduced therein such as the P-cladding 24 and P-cap layers 26 utilize suitable P-type dopants such as zinc, magnesium, and beryllium. The amounts of the particular dopant introduced as well as the thickness of the various layers utilized in the semiconductor laser structure 10 are well known to those skilled in the art and may be varied as required. Additionally, the actual number of layers may be varied as some of the layers may be omitted in particular applications as is well known to those skilled in the art.

The first and second confinement regions surrounding the quantum well region 20 serve to provide both carrier confinement to the carriers propagating within the active region 20 and optical confinement. Additional carrier confinement to produce a more efficiently operating semiconductor laser diode may be accomplished by increasing the bandgap difference in the confinement layers adjacent to the quantum well region 20. As shown in FIG. 1, a multi-quantum barrier 18a and 22a is introduced in each of the two confinement layers to further increase the effective barrier height to the carriers in the quantum well region. Although not shown in FIG. 1, increased carrier confinement may also be attained by placement of the multi-quantum barrier in the N- and P-cladding layers. In either location, the multi-quantum barriers are comprised of a plurality of $(Al_xGa_{1-x})_{0.5}In_{0.5}P$ layers in which the value of x alternates between a large value forming a multi-quantum barrier layer having a relatively large energy bandgap and a small value forming a multi-quantum barrier layer having a relatively small energy bandgap. Preferably the values of x which are alternately employed by the multi-quantum barrier layers are selected to be the largest and the smallest amounts of aluminum present in the confinement region. For example, in the semiconductor laser diode described heretofore the maximum fractional percentage of aluminum is 0.8 while the minimal amount of aluminum content is 0.2. Thus the composition of the multi-quantum barrier layers will preferably alternate between $(Al_{0.8}Ga_{0.2})_{0.5}In_{0.5}P$ and $(Al_{0.2}Ga_{0.8})_{0.5}In_{0.5}P$. The multi-quantum barrier layers are relatively thin and are designed to have a thickness of approximately $\lambda/4$ in which $\lambda$ is the wavelength of the carriers to be contained, i.e. the holes and electrons. For example, for an $(Al_xGa_{1-x})_{0.5}In_{0.5}P$ laser emitting light at 665 nanometers, the thickness of the alternating multi-quantum barrier layers are preferably 15-20 angstroms. Additionally, the thickness of the multi-quantum barrier layers need not all be identical. The wavelength of the holes and electrons propagating within the quantum well region are not all identical but are instead spread over a range of wavelength values. Thus, the thickness of the individual layers of the multi-quantum barrier may also be varied in thickness with the varied thickness selected to be $\lambda/4$ wherein $\lambda$ is selected to be a wavelength present in the range of wavelengths of the electrons, preferably, one of the dominant wavelength of the electrons. One method of approximating such variance in the electrons' wavelength and the corresponding variation in the thickness of the multi-quantum barrier layers is to determine the predominant wavelength of the electrons and the corresponding thickness of a multi-quantum barrier layer. Multi-quantum barrier layers can then be deposited which are allowed to vary 15-20% from this predetermined thickness corresponding to the electrons' most prevalent wavelength so as to approximate the thickness required to properly interfere with the electron waves having wavelengths differing somewhat from that of the predominant electron wavelength.

The number of multi-quantum barrier layers may be varied as required by the particular application with increased numbers of layers improving the carrier confinement to some extent while increasing the time required to fabricate the device. The multi-quantum barrier layers may be positioned anywhere within the graded index confinement layer or cladding layer, however, as it is preferable that the aluminum concentration of the alternating multi-quantum barrier layers in the confinement layers equal the largest and smallest aluminum fraction of the graded index layers, positioning of the multi-quantum barrier layers near the quantum well region or near the cladding layers reduces the amount by which the multi-quantum barrier layers' percentage of aluminum can vary from that of the graded index layers it is inserted within. For example, should the multi-quantum barrier layers be positioned near the cladding layers in a region of the graded index confinement layers having a fractional content of aluminum of 0.75, the multi-quantum barrier layers having a percentage of aluminum of 0.8, the maximum fractional percentage of aluminum in the graded index confinement layers, would only vary from the graded index layers it is inserted within by 0.05. Such a small variance in the percentage of aluminum between the graded index layers and the inserted multi-quantum barrier layers tends to decrease the effectiveness of the multi-quantum barrier layers. Thus, it is preferable to position the multi-quantum barrier layers in the cental portion of each graded confinement layer such that each of the multi-quantum barrier layers for percentage of aluminum may vary substantially from the percentage of aluminum present in the surrounding confinement layer.

The multi-quantum barrier layers may be either strained or unstrained. If unstrained the multi-quantum barrier layers should have a lattice constant matching that of the confinement layers within which they are positioned. Strained layers, however, produce increased barrier height if the multi-quantum barrier layers are fabricated to have alternating compressive and tensile strains. Thus, the multi-quantum barrier layer nearest the substrate of the semiconductor laser device may be deposited having a lattice constant slightly larger than that of the graded index layer upon which it is deposited so as to be in compressive strain. The subsequent multi-quantum barrier layer deposited thereupon would have a lattice constant slightly less than that of the graded index confinement layer so as to be in tensile strain. This alternating pattern of compressively and tensilely strained multi-quantum barrier layers should provide an increased barrier to the carriers within the quantum well region and would also maintain the average strain of all the layers near zero.

The multi-quantum barrier layers may be deposited or grown by any of the methods well known to those skilled in the art such as metal organic chemical vapor deposition, molecular beam epitaxy, metal organic molecular beam epitaxy, and atomic layer epitaxy.

Although there have been illustrated and described specific detail and structure of operations, it is clearly understood that same were for purposes of illustration and that changes and modifications may be readily made therein by those skilled in the art without departing from the spirit and scope of this invention.

What is claimed is:

1. A semiconductor laser, comprising:
    (a) a semiconductor substrate; and
    (b) a plurality of semiconductor layers, positioned upon said semiconductor substrate, comprising:
        (1) a quantum well region for propagating optical signals along an axis of propagation, said quantum well region having a PN junction proximate thereto;
        (2) a first graded index layer having a graded index of refraction disposed adjacent a first side of said quantum well region, said graded index of refraction being largest at the interface of said first graded index layer and said quantum well region and decreasing in a direction away from said quantum well region;

(3) a second graded index layer having a graded index of refraction disposed adjacent a second side of said quantum well region, said graded index of refraction being largest at the interface of said second graded index layer and said quantum well region and decreasing in a direction away from said quantum well region;

(4) a plurality of first quantum barrier layers positioned within said first graded index layer having alternating large and small bandgaps whereby each layer having a large bandgap is disposed adjacent a layer having a small bandgap; and (5) a plurality of second quantum barrier layers positioned within said second graded index layer having alternating large and small bandgaps whereby each layer having a large bandgap is disposed adjacent a layer having a small bandgap.

2. A semiconductor laser as recited in claim 1 wherein each of said plurality of first quantum barrier layers and each of said plurality of second quantum barrier layers have a thickness approximately equal to $\lambda/4$, where $\lambda$ is the predominant wavelength of the electrons propagated within the quantum well region.

3. A semiconductor laser as recited in claim 1 wherein each of said plurality of first quantum barrier layers and each of said plurality of second quantum barrier layers have a thickness within a range from $(0.8\lambda)/4$ to $(1.2\lambda)/4$, wherein $\lambda$ is the predominant wavelength of the electrons propagated within the quantum well region.

4. A semiconductor laser as recited in claim 1 wherein said plurality of first quantum barrier layers and said plurality of second quantum barrier layers are each comprised of strained layers having alternating compressive and tensile strain imposed thereupon whereby each layer under compressive strain is disposed adjacent a layer under tensile strain.

5. A semiconductor laser as recited in claim 1 wherein said semiconductor layers are selected from the group consisting of alloys of $(Al_xGa_{1-x})_{0.5}In_{0.5}P$ and $Al_xGa_{1-x}As$.

6. A semiconductor laser as recited in claim 1 wherein said plurality of first quantum barrier layers are positioned substantially in the center of said first graded index layer and wherein said plurality of second quantum barrier layers are positioned substantially in the center of said second graded index layers.

7. A semiconductor laser, comprising:
(a) a semiconductor substrate comprised of GaAs; and
(b) a plurality of semiconductor layers, positioned upon said semiconductor substrate, comprising:
(1) a quantum well region comprised of $(Al_xGa_{1-x})_yIn_{1-y}P$ for propagating optical signals along an axis of propagation wherein x and y each have values selected from the range of 0 to 1, said quantum well region having a PN junction proximate thereto;
(2) a first graded index layer having a graded index of refraction disposed adjacent a first side of said quantum well region, said graded index of refraction layer being comprised of $(Al_xGa_{1-x})_{0.5}In_{0.5}P$ wherein x increases from a minimum value at the interface of said quantum well region and said first graded index layer to a maximum value, said increase occurring in a direction away from said quantum well region;

(3) a second graded index layer having a graded index of refraction disposed adjacent a second side of said quantum well region, said graded index of refraction layer being comprised of $(Al_xGa_{1-x})_{0.5}In_{0.5}P$ wherein x increases from a minimum value at the interface of said quantum well region and said second graded index layer to a maximum value, said increase occurring in a direction away from said quantum well region;

(4) a plurality of first quantum barrier layers comprised of $(Al_xGa_{1-x})_{0.5}In_{0.5}P$ positioned within said first graded index layer having alternating large and small bandgaps whereby each layer having a large bandgap is disposed adjacent a layer having a small bandgap; and (5) a plurality of second quantum barrier layers comprised of $(Al_xGa_{1-x})_{0.5}In_{0.5}P$ positioned within said second graded index layer having alternating large and small bandgaps whereby each layer having a large bandgap is disposed adjacent a layer having a small bandgap.

8. A semiconductor laser as recited in claim 7 wherein said plurality of first quantum barrier layers and said plurality of second quantum barrier layers are each comprised of alternating layers of $(Al_xGa_{1-x})_{0.5}In_{0.5}P$ wherein the value of x is equal to the maximum value of x in said first graded index layer and $(Al_xGa_{1-x})_{0.5}In_{0.5}P$ wherein the value of x is equal to the minimum value of x in the first graded index layer.

9. A semiconductor laser as recited in claim 8 wherein said maximum value of x is 0.8 and said minimum value of x is 0.2.

10. A semiconductor laser, comprising:
(a) a semiconductor substrate; and
(b) a plurality of semiconductor layers, positioned upon said semiconductor substrate, comprising:
(1) a quantum well region for propagating optical signals along an axis of propagation, said quantum well region having a PN junction proximate thereto;
(2) a first graded index layer having a graded index of refraction disposed adjacent a first side of said quantum well region, said graded index of refraction being largest at the interface of said first graded index layer and said quantum well region and decreasing in a direction away from said quantum well region;
(3) a second graded index layer having a graded index of refraction disposed adjacent a second side of said quantum well region, said graded index of refraction being largest at the interface of said second graded index layer and said quantum well region and decreasing in a direction away from said quantum well region;
(4) a first cladding layer disposed adjacent said first graded index layer for further confining said optical signals;
(5) a second cladding layer disposed adjacent said second graded index layer for further confining said optical signals;
(6) a plurality of first quantum barrier layers positioned within said first cladding layer having alternating large and small bandgaps whereby each layer having a large bandgap is disposed adjacent a layer having a small bandgap; and (7) a plurality of second quantum barrier layers positioned within said second cladding layer having alternating large and small bandgaps whereby each layer having a large bandgap is disposed adjacent a layer having a small bandgap.

11. A semiconductor laser as recited in claim 10 wherein each of said plurality of first quantum barrier layers and each of said plurality of second quantum barrier layers have a thickness approximately equal to $\lambda/4$, wherein $\lambda$ is the predominant wavelength of the electrons propagated within the quantum well region.

12. A semiconductor laser as recited in claim 10 wherein each of said plurality of first quantum barrier layers and each of said plurality of second quantum barrier layers have a thickness within a range from $(0.8\lambda)/4$ to to $(1.2\lambda)/4$, wherein $\lambda$ is the predominant wavelength of the electrons propagated within the quantum well region.

13. A semiconductor laser as recited in claim 10 wherein said plurality of first quantum barrier layers and said plurality of second quantum barrier layers are each comprised of strained layers having alternating compressive and tensile strain imposed thereupon whereby each layer under compressive strain is disposed adjacent a layer under tensile strain.

14. A semiconductor laser as recited in claim 10 wherein said semiconductor layers are selected from the group consisting of alloys of $(Al_xGa_{1-x})_{0.5}In_{0.5}P$ and $Al_xGa_{1-x}As$.

* * * * *